US008922286B2

(12) United States Patent
Yamada et al.

(10) Patent No.: US 8,922,286 B2
(45) Date of Patent: Dec. 30, 2014

(54) RESONATOR ELEMENT, RESONATOR, OSCILLATOR, ELECTRONIC APPARATUS, AND MOBILE OBJECT

(71) Applicant: Seiko Epson Corporation, Tokyo (JP)

(72) Inventors: Akinori Yamada, Ina (JP); Masaru Mikami, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/022,921

(22) Filed: Sep. 10, 2013

(65) Prior Publication Data
US 2014/0070901 A1    Mar. 13, 2014

(30) Foreign Application Priority Data

Sep. 13, 2012  (JP) ................................. 2012-201304

(51) Int. Cl.
*H03B 5/30* (2006.01)
(52) U.S. Cl.
CPC ........................................ *H03B 5/30* (2013.01)
USPC ............................ 331/154; 310/348; 310/370
(58) Field of Classification Search
USPC .......... 331/107 R, 116 R, 154, 156; 310/344, 310/348, 367, 370
See application file for complete search history.

(56) References Cited

U.S. PATENT DOCUMENTS

| 6,700,313 | B2 | 3/2004 | Dalla Piazza et al. | |
| 7,084,556 | B1* | 8/2006 | Dalla Piazza et al. | 310/370 |
| 7,112,914 | B1* | 9/2006 | Dalla Piazza et al. | 310/348 |
| 7,193,354 | B2 | 3/2007 | Kawashima | |
| 2004/0263027 | A1 | 12/2004 | Kawashima | |
| 2007/0188045 | A1 | 8/2007 | Ikeda et al. | |
| 2009/0167118 | A1* | 7/2009 | Yoshimatsu et al. | 310/370 |
| 2011/0018399 | A1* | 1/2011 | Murata et al. | 310/346 |

FOREIGN PATENT DOCUMENTS

| EP | 1 732 219 B1 | 3/2008 |
| EP | 1 732 220 B1 | 3/2008 |
| EP | 1 732 217 B1 | 1/2009 |
| JP | A-49-98219 | 9/1974 |
| JP | U-50-85170 | 7/1975 |
| JP | A-2-149118 | 6/1990 |
| JP | A-5-191190 | 7/1993 |
| JP | U-5-68121 | 9/1993 |
| JP | A-7-74576 | 3/1995 |
| JP | A-9-238041 | 9/1997 |
| JP | A-10-22776 | 1/1998 |
| JP | A-2000-013171 | 1/2000 |
| JP | A-2000-013178 | 1/2000 |
| JP | A-2001-36345 | 2/2001 |
| JP | A-2002-09576 | 1/2002 |
| JP | A-2002-141770 | 5/2002 |
| JP | A-2003-152499 | 5/2003 |
| JP | A-2004-328338 | 11/2004 |
| JP | A-2004-357178 | 12/2004 |

(Continued)

*Primary Examiner* — Robert Pascal
*Assistant Examiner* — Jeffrey Shin
(74) *Attorney, Agent, or Firm* — Oliff PLC

(57) ABSTRACT

A resonator element includes a base section, a pair of vibrating arms projecting toward the same side from the base section, and disposed side by side in a predetermined direction, a support arm projecting from the base section toward the same side as the pair of vibrating arms, disposed between the pair of vibrating arms, and having a recessed portion disposed on one principal surface, and a first electrically-conductive pad and a second electrically-conductive pad disposed side by side across the recessed portion.

12 Claims, 13 Drawing Sheets

(56) References Cited

FOREIGN PATENT DOCUMENTS

| | | |
|---|---|---|
| JP | A-2006-345518 | 12/2006 |
| JP | A-2006-345519 | 12/2006 |
| JP | A-2007-96528 | 4/2007 |
| JP | A-2007-288644 | 11/2007 |
| JP | A-2008-131167 | 6/2008 |
| JP | B2-4259842 | 4/2009 |
| JP | A-2009-171591 | 7/2009 |
| JP | B2-4379119 | 12/2009 |
| JP | A-2010-259023 | 11/2010 |
| JP | A-2011-91670 | 5/2011 |
| JP | A-2011-151567 | 8/2011 |
| JP | A-2011-151568 | 8/2011 |
| JP | A-2011-250478 | 12/2011 |
| JP | B2-4904091 | 3/2012 |
| JP | A-2012-119920 | 6/2012 |
| WO | WO 2005/090912 A1 | 9/2005 |

\* cited by examiner

RESONATOR ELEMENT, RESONATOR, OSCILLATOR, ELECTRONIC APPARATUS, AND MOBILE OBJECT

BACKGROUND

1. Technical Field

The present invention relates to a resonator element, a resonator, an oscillator, an electronic apparatus, and a mobile object.

2. Related Art

In small-sized information equipment such as a hard disk drive (HDD), a mobile computer, or an IC card, mobile communication equipment such as a cellular phone, an automobile telephone, or a paging system, and so on, an electronic device such as a resonator or an oscillator is used widely.

In the past, a device having a resonator element housed in a package has been known as an oscillator (see, e.g., JP-A-2002-141770 (Document 1)). The resonator element provided to the oscillator of Document 1 has a base section, two vibrating arms extending from the base section so as to be arranged in parallel to each other, and a support arm extending from the base section and located between the two vibrating arms. Further, each of the vibrating arms has electrodes disposed respectively on four surfaces constituting the periphery of the vibrating arm, and each of the electrodes is connected to either one of two electrically-conductive pads disposed side by side on one of the principal surfaces of the support arm via wiring. Such a resonator element is fixed to the package in the portions of the respective electrically-conductive pads via an electrically-conductive adhesive, and each of the electrically-conductive pads is electrically connected to an electrode of the package via an electrically-conductive adhesive.

However, in the case of attempting to miniaturize the resonator element, since in the resonator element disclosed in Document 1 the bonding sections (electrically-conductive pads) of the resonator element with the electrically-conductive adhesive are arranged two-dimensionally, there is a problem that the bonding area between the resonator element and the electrically-conductive adhesive is reduced, and therefore, the electrically-conductive adhesive has contact with another electrode to cause short circuit.

SUMMARY

An advantage of some aspects of the invention is to solve at least a part of the problem described above, and the invention can be implemented as the following forms or application examples.

Application Example 1

This application example is directed to a resonator element including a base section, a pair of vibrating arms projecting toward one direction from the base section, and disposed side by side in a direction intersecting with the one direction, and a support arm projecting toward the one direction from the base section, disposed between the pair of vibrating arms, and provided with a first electrically-conductive pad and a second electrically-conductive pad disposed on one principal surface, and in a plan view of the one principal surface, the one principal surface of the support arm is provided with a first recessed portion disposed between the first electrically-conductive pad and the second electrically-conductive pad.

According to this application example, by disposing the recessed portion between the first electrically-conductive pad and the second electrically-conductive pad of the support arm, the contact of the electrically-conductive adhesive can be prevented in the case in which the resonator element is supported by and bonded to the package substrate in the electrically-conductive pads using the electrically-conductive adhesive or the like. Specifically, even in the case in which the electrically-conductive adhesive on the electrically-conductive pad excessively spreads to wet the lower surface of the support arm, by making the electrically-conductive adhesive enter the recessed portion, the electrically-conductive adhesive can be prevented from spreading toward the electrically-conductive adhesive on the other electrically-conductive pad, and thus, there is an advantage that the short circuit due to the contact with the other electrically-conductive pad can be prevented.

Application Example 2

This application example is directed to the resonator element according to the application example described above, wherein the first recessed portion has a bottom, and another principal surface of the support arm is provided with a second recessed portion having a bottom and disposed so as not to overlap the first recessed portion in a plan view of the one principal surface.

According to this application example, by disposing a plurality of recessed portions between the first electrically-conductive pad and the second electrically-conductive pad of the support arm, the spread of the electrically-conductive adhesive on the electrically-conductive pad is absorbed by the recessed portions, and there is an advantage that the short circuit due to the contact with the other electrically-conductive pad can more surely be prevented.

Application Example 3

This application example is directed to the resonator element according to the application example described above, wherein the support arm is provided with at least one hole disposed along an outer edge of at least one of the first electrically-conductive pad and the second electrically-conductive pad.

According to this application example, by disposing at least one hole along the periphery of the first electrically-conductive pad and the second electrically-conductive pad of the support arm, the spread of the electrically-conductive adhesive on the electrically-conductive pad is absorbed by the hole, and there is an advantage that the short circuit due to the contact with the other electrically-conductive pad can more surely be prevented.

Application Example 4

This application example is directed to the resonator element according to the application example described above, wherein the support arm is provided with at least one through hole, and an opening of the through hole is disposed in an outer edge of at least one of the first electrically-conductive pad and the second electrically-conductive pad in a plan view.

According to this application example, by disposing the through hole so as to have contact with the electrically-conductive pad of the support arm, it is possible to make the electrically-conductive adhesive enter the inside of the through hole. Therefore, the bonding area between the resonator element and the adhesive can be increased, and there is advantage that bonding strength between the resonator element and the package substrate can further be improved while surely achieving the electrical conduction.

Application Example 5

This application example is directed to a resonator including the resonator element of the application example described above, and a container adapted to house the resonator element.

According to this application example, since the influence of a disturbance such as a temperature variation or a humidity variation, and the influence of contamination can be prevented by housing the resonator element in the container, there is an advantage that the resonator superior in frequency reproducibility, frequency-temperature characteristic, CI-temperature characteristic, and frequency-aging characteristic can be obtained.

Application Example 6

This application example is directed to an oscillator including the resonator element according to the application example described above, and an oscillator circuit.

According to this application example, since the oscillator can be constituted by the resonator element, miniaturization of which can be achieved by disposing the support arm between the vibrating arms, the oscillator circuit for exciting the resonator element, and so on, there is an advantage that a small-sized oscillator having a stable oscillation characteristic can be obtained.

Application Example 7

This application example is directed to an electronic apparatus including the resonator element according to the application example described above.

According to this application example, since the small-sized resonator element is used, there is an advantage that an electronic apparatus equipped with the small-sized oscillator having a stable oscillation characteristic can be configured.

Application Example 8

This application example is directed to a mobile object including the resonator element according to the application example described above.

According to this application example, since the small-sized resonator having the small-sized resonator element, and superior in frequency reproducibility and frequency-aging characteristic can be used, there is an advantage that a mobile object provided with a stable and accurate electronic control unit can be configured.

BRIEF DESCRIPTION OF THE DRAWINGS

The invention will be described with reference to the accompanying drawings, wherein like numbers reference like elements.

FIGS. 1A and 1B are schematic diagrams showing a structure of a resonator element according to a first embodiment of the invention, wherein FIG. 1A is a plan view, and FIG. 1B is a cross-sectional view along the A-A line.

FIGS. 2A and 2B are plan views showing an electrode configuration of the resonator element according to the first embodiment of the invention, wherein FIG. 2A is a top view, and FIG. 2B is a bottom view (a transparent view).

FIGS. 5A and 5B are schematic diagrams showing a structure of a support arm of a resonator element according to a second embodiment of the invention, wherein FIG. 5A is a plan view, and FIG. 5B is a cross-sectional view along the C-C line.

FIGS. 6A and 6B are schematic diagrams showing a structure of a support arm of a resonator element according to a third embodiment of the invention, wherein FIG. 6A is a plan view, and FIG. 6B is a cross-sectional view along the D-D line.

FIGS. 7A and 7B are schematic diagrams showing a structure of a support arm of a resonator element according to a fourth embodiment of the invention, wherein FIG. 7A is a plan view, and FIG. 7B is a cross-sectional view along the E-E line.

FIGS. 8A and 8B are schematic diagrams showing a structure of a support arm of a resonator element according to a fifth embodiment of the invention, wherein FIG. 6A is a plan view, and FIG. 6B is a cross-sectional view along the F-F line.

FIGS. 9A and 9B are schematic diagrams showing a structure of the resonator according to an embodiment of the invention, wherein FIG. 9A is a plan view, and FIG. 9B is a cross-sectional view along the G-G line.

DESCRIPTION OF EXEMPLARY EMBODIMENTS

Some embodiments of the invention will hereinafter be explained in detail with reference to the accompanying drawings.

Resonator Element

First Embodiment

Figure 1A:
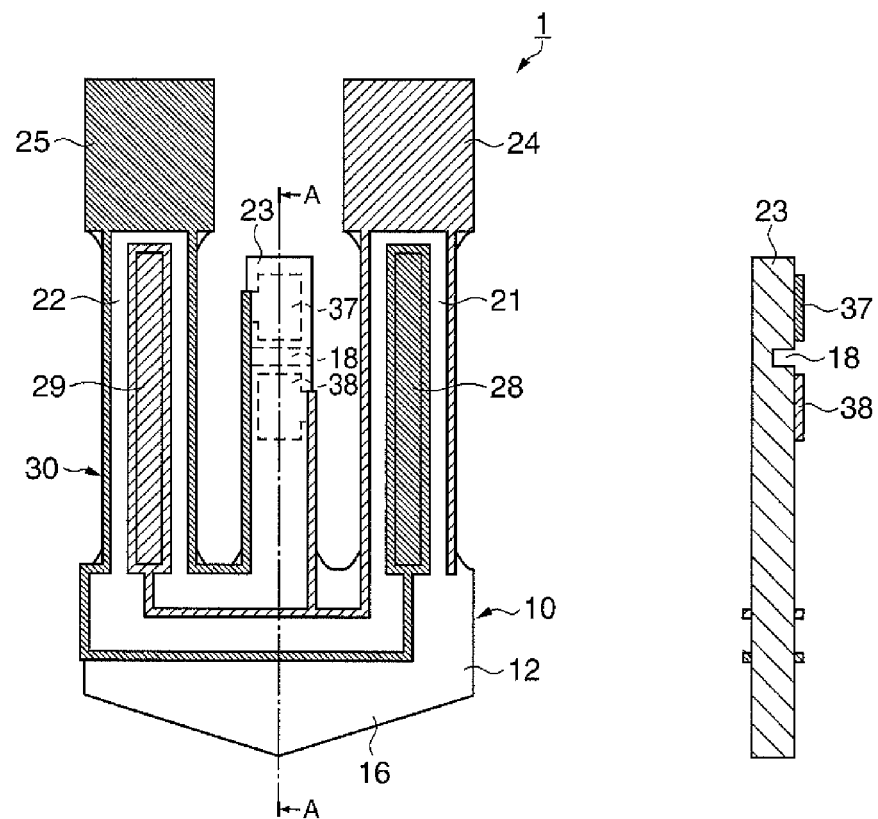
Figure 1B:
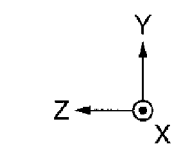
Figures 2A, 2B:
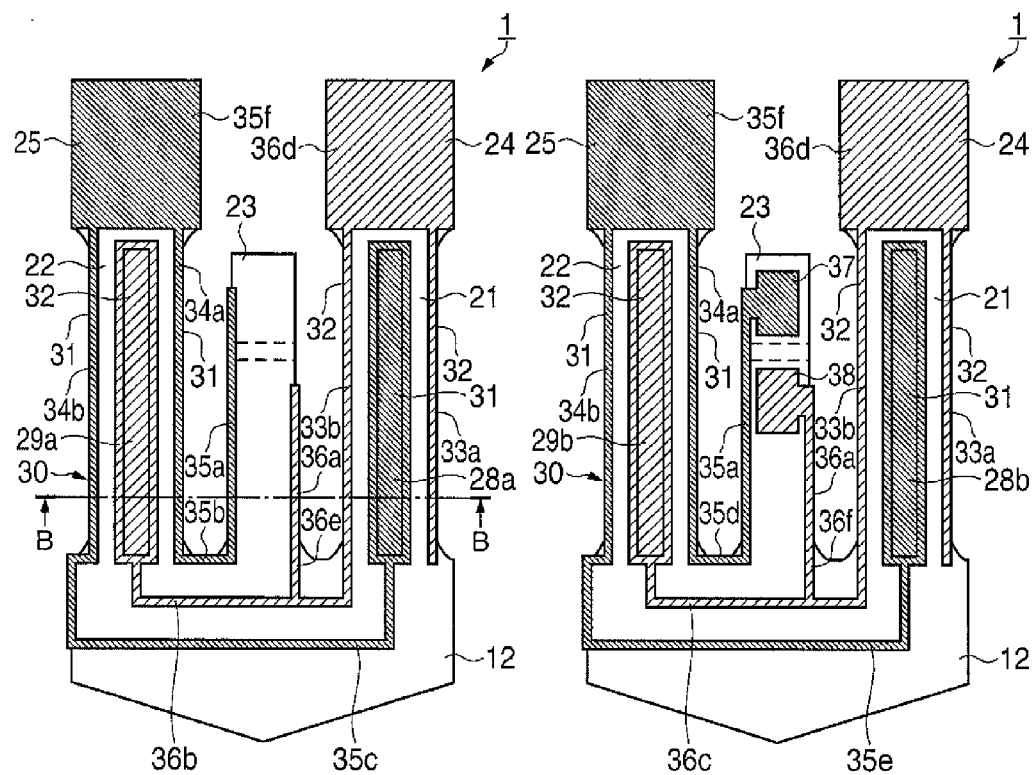
Figure 3:
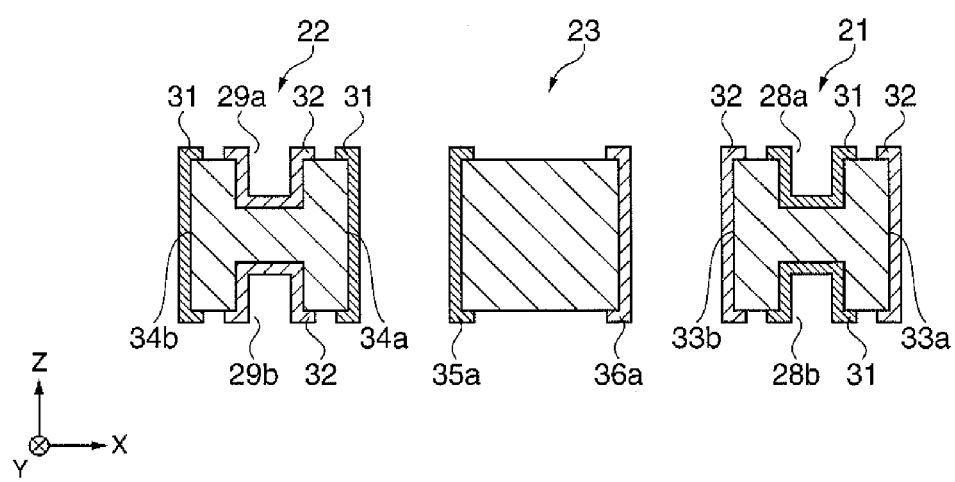
FIG. 3 is a cross-sectional view along the B-B line in FIG. 2A.

FIGS. 1A and 1B are schematic diagrams showing a structure of a resonator element according to a first embodiment of the invention, wherein FIG. 1A is a plan view, and FIG. 1B is a cross-sectional view along the A-A line in FIG. 1A. FIGS. 2A and 2B are plan views of the resonator element according to the first embodiment of the invention, wherein FIG. 2A is a top view, and FIG. 23 is a bottom view (a transparent view). FIG. 3 is a cross-sectional view along the B-B line in FIG. 2A.

FIGS. 4A through 4D are cross-sectional views for explaining a method of manufacturing the resonator element shown in FIGS. 1A and 1B. It should be noted that in each of the drawings, the X axis, the Y axis, and the Z axis are shown as the three axes perpendicular to each other for the sake of convenience of explanation. Further, the plan view viewed from the Z-axis direction is also referred to simply as a "plan view" in the following explanation for the sake of convenience of explanation. Further, for the sake of convenience of explanation, in the following explanation, the surface in the +Z-axis direction is referred to as an upper surface, and the surface in the −Z-axis direction is referred to as a lower surface in the plan view viewed from the Z-axis direction.

The resonator element 1 shown in FIGS. 1A and 1B is composed of a vibrating substrate 10 provided with a base section 12, vibrating arms 21, 22, and hammerheads 24, 25, and electrodes 30 used for driving disposed on the vibrating substrate 10.

The vibrating substrate 10 is formed of quartz crystal, in particular Z-cut quartz crystal, for example, as a piezoelectric substrate. Thus, the resonator element 1 can exert superior vibration characteristics. The Z-cut quartz crystal plate is a quartz crystal substrate having the Z axis (the light axis) of the quartz crystal along the thickness direction. Although it is preferable for the Z axis to coincide with the thickness direction of the vibrating substrate 10, it results that the Z axis is tilted slightly (e.g., roughly 15° or smaller) with respect to the thickness direction from the viewpoint of reducing the frequency-temperature variation in the vicinity of the room temperature.

The vibrating substrate 10 has the base section 12, the two vibrating arms 21, 22 projecting from the base section 12 toward the +Y-axis direction and disposed side by side in the X-axis direction, and a support arm 23 projecting from the base section 12 toward the +Y-axis direction, and located between the two vibrating arms 21, 22.

The base section 12 spreads in the X-Y plane, and has a roughly plate-like shape having a thickness in the Z-axis direction. The base section 12 of the present embodiment has a shrunk-width portion 16 having the width gradually decreasing toward the −Y-axis direction disposed on the opposite side to the vibrating arms 21, 22, and the support arm 23. Since such a shrunk-width portion 16 is provided, the vibration leakage can be suppressed. It should be noted that the shrunk-width portion 16 can be provided if needed, and can also be eliminated.

The vibrating arms 21, 22 are disposed side by side in the X-axis direction, and each extend (project) from the base section 12 in the +Y-axis direction. Further, the vibrating arms 21, 22 are provided with hammerheads 24, 25 at the tips thereof, respectively. By providing such hammerheads 24, 25, miniaturization of the resonator element 1 can be achieved, and the frequency of the flexural vibration of the vibrating arms 21, 22 can be lowered. It should be noted that the hammerheads 24, 25 can each have a plurality of widths if needed, or can also be eliminated.

Further, both of principal surfaces of the vibrating arms 21, 22 are provided with grooves 28, 29 each having a bottom and opening in the principal surface. These grooves 28, 29 are disposed so as to extend in the Y-axis direction, and have the same shape as each other. Therefore, the vibrating arms 21, 22 each have a roughly "H" shaped lateral cross-sectional shape. By forming such grooves 28, 29, it becomes difficult for the heat generated by the flexural vibration to diffuse (make heat conduction), and the thermoelastic loss can be suppressed in the heat insulating area, which is an area where the flexural vibration frequency (the mechanical flexural vibration frequency) f is higher than a thermal relaxation frequency f0 (f>f0). It should be noted that the grooves 28, 29 can be provided if needed, and can also be eliminated.

The support arm 23 extends from the base section 12 in the +Y-axis direction, and is located between the vibrating arms 21, 22. Further, the support arm 23 has an elongated shape, and has a roughly uniform width (length in the X-axis direction) throughout the entire area in the longitudinal direction. Further, the support arm 23 is further provided with first and second electrically-conductive pads 37, 38 disposed on the lower surface of the support arm 23, and a recessed portion is disposed between the first and second electrically-conductive pads 37, 38. The recessed portion 18 extends in the X-axis direction, and has both ends opening respectively in side surfaces of the support arm 23. Such a recessed portion 18 has a function of preventing contact of the electrically-conductive adhesive in the case of being supported by and bonded to a package substrate with the electrically-conductive adhesive in the first and second electrically-conductive pads 37, 38. Specifically, even in the case in which the electrically-conductive adhesive on the first electrically-conductive pad 37 excessively spreads to wet the lower surface of the support arm 23, since the electrically-conductive adhesive thus leaking enters the recessed portion 18, it is possible to prevent the electrically-conductive adhesive from further spreading toward the electrically-conductive adhesive on the second electrically-conductive pad 38. Further, in a similar manner, even in the case in which the electrically-conductive adhesive on the second electrically-conductive pad 38 excessively spreads to wet the lower surface of the support arm 23, since the electrically-conductive adhesive thus leaking enters the recessed portion 18, it is possible to prevent the electrically-conductive adhesive from further spreading toward the electrically-conductive adhesive on the first electrically-conductive pad 37. Therefore, the short circuit due to the contact between the electrically-conductive adhesives on the respective first and second electrically-conductive pads 37, 38 can effectively be prevented. It should be noted that the shape (in particular the plan view shape) of the support arm 23 is not particularly limited, and can include a portion with a variation in width in the middle of the support arm in the longitudinal direction thereof.

Hereinabove, the configuration of the resonator element 1 is briefly explained. Then, the electrodes 30 disposed on the vibrating substrate 10 will be explained.

FIGS. 2A and 2B are plan views showing an electrode configuration of the resonator element according to the first embodiment of the invention, wherein FIG. 2A is a top view, and FIG. 2B is a bottom view (a transparent view) of FIG. 2A. Further, FIG. 3 is a cross-sectional view along the B-B line in FIG. 2A.

As shown in FIGS. 2A, 2B, and 3, the electrodes 30 include a plurality of first driving electrodes 31, the first electrically-conductive pad 37, wiring lines 35a, 35b, 35c, 35d, 35e, and 35f for connecting the plurality of first driving electrodes 31 and the first electrically-conductive pad 37 to each other, a plurality of second driving electrodes 32, the second electrically-conductive pad 38, wiring lines 36a, 36b, 36c, 36d, 36e, and 36f for connecting the plurality of second driving electrodes 32 and the second electrically-conductive pad 38 to each other.

The first driving electrodes 31 are respectively disposed on the internal surfaces of the grooves 28a, 28b of the vibrating arm 21, and the side surfaces 34a, 34b of the vibrating arm 22. The first driving electrode 31 on the groove 28a is connected to the first driving electrode 31 on the side surface 34b via the wiring line 35c disposed straddling the upper surface and the side surface of the base section 12, and the first driving electrode 31 on the groove 28b is connected to the first driving electrode 31 on the side surface 34b via the wiring line 35e disposed straddling the lower surface and the side surface of the base section 12. It should be noted that the wiring lines 35c, 35e are connected to each other on the side surface of the base section 12. Then, the first driving electrode 31 on the side surface 34b is connected to the first driving electrode 31 on the side surface 34a via the wiring line 35f disposed on the hammerhead 25. Further, the first driving electrode 31 on the side surface 34a is connected to the wiring line 35a disposed on the side surface of the support arm 23 via the wiring lines 35b, 35d disposed respectively on the upper surface and the lower surface of the base section 12. Further, the wiring line 35a is electrically connected to the first electrically-conductive pad 37 disposed on the lower surface of the support arm 23.

Meanwhile, the second driving electrodes 32 are respectively disposed on the internal surfaces of the grooves 29a, 29b of the vibrating arm 22, and the side surfaces 33a, 33b of the vibrating arm 21. The second driving electrode 32 on the groove 29a is connected to the second driving electrode 32 on the side surface 33b via the wiring line 36b disposed on the upper surface of the base section 12, and the second driving electrode 32 on the groove 29b is connected to the second driving electrode 32 on the side surface 33b via the wiring line 36c disposed on the lower surface of the base section 12. Then, the second driving electrode 32 disposed on the side surface 33b is connected to the second driving electrode 32 disposed on the side surface 33a via the wiring line 36d disposed on the hammerhead 24. Further, the wiring line 36b on the upper surface of the base section 12 is connected to the wiring line 36a disposed on the side surface of the support arm 23 via the wiring line 36e disposed on the upper surface of the base section 12, and the wiring line 36c on the lower surface of the base section 12 is connected to the wiring line 36a disposed on the side surface of the support arm 23 via the wiring line 36f disposed on the lower surface of the base section 12. Further, the wiring line 36a is electrically connected to the second electrically-conductive pad 38 disposed on the lower surface of the support arm 23.

Thus, by applying a drive voltage from the first and second electrically-conductive pads 37, 38 to the first and second driving electrodes 31, 32 via the wiring lines, the electric field is appropriately generated inside the vibrating arms of the resonator element, and the two vibrating arms 21, 22 vibrate at a predetermined frequency in a roughly in-plane direction (in the X-Y plane direction) so as to repeat getting closer to and away from each other.

The constituent material of the electrodes 30 is not particularly limited, and a metal material such as gold (Au), gold alloy, platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), or zirconium (Zr), and an electrically-conductive material such as indium tin oxide (ITO) can be used.

The resonator element 1 is hereinabove explained. Such a resonator element 1 can be manufactured in the following manner. It should be noted that the manufacturing method explained hereinafter is illustrative only, and it is also possible to manufacture the resonator element 1 using other manufacturing methods.

FIGS. 4A through 4D are cross-sectional views of the vibrating arms 21, 22 provided with the grooves 28a, 28b, 29a, and 29b and the support arm 23 for explaining the method of manufacturing the resonator element shown in FIGS. 2A and 2B.

Figure 4A:
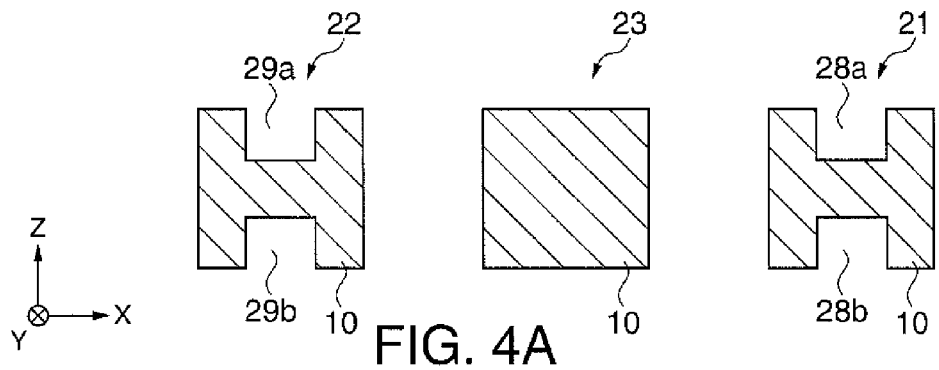
FIGS. 4A through 4D are cross-sectional views of vibrating arms and a support arm showing a method of manufacturing the resonator element according to an embodiment of the invention.

Firstly, as shown in FIG. 4A, the vibrating substrate 10 is prepared. The vibrating substrate 10 can be manufactured by performing the patterning of the outer shape of the resonator element on the Z-cut quartz crystal substrate, and then performing a wet-etching process.

Figure 4B:
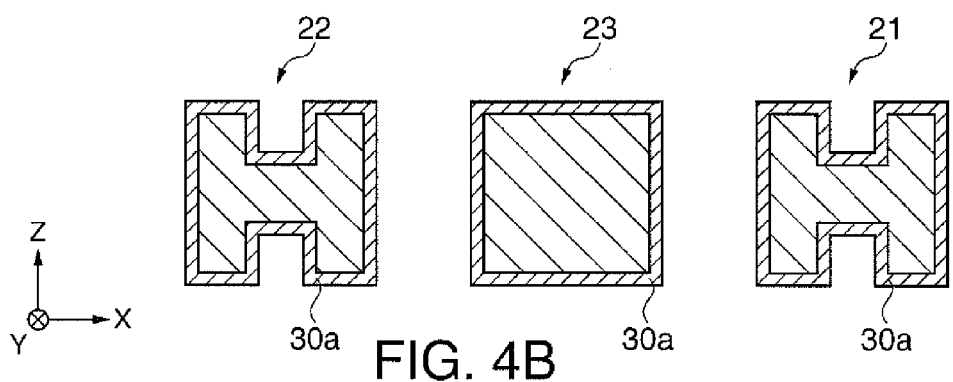

Then, as shown in FIG. 4B, the electrode film 30a is deposited on the entire surfaces of the vibrating substrate 10 by, for example, evaporation or sputtering.

Figure 4C:
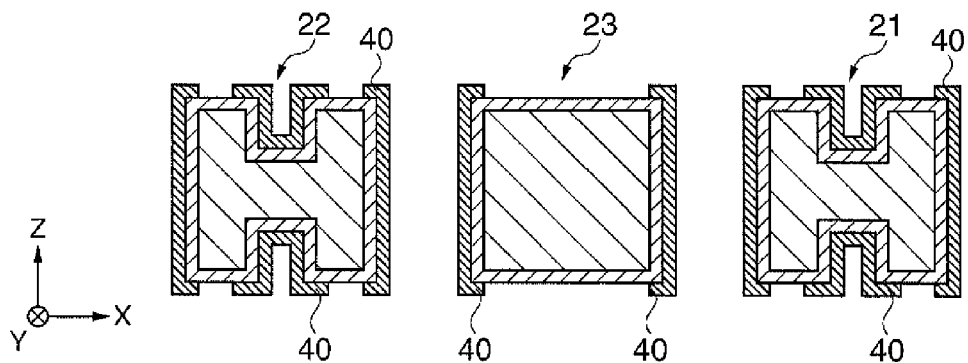

Subsequently, as shown in FIG. 4C, by depositing a resist film 40 (a positive type photoresist film) on the electrode film 30a, and then patterning the resist film 40 by exposure and development, the resist pattern corresponding to the shapes of the electrodes 30 is formed.

Figure 4D:
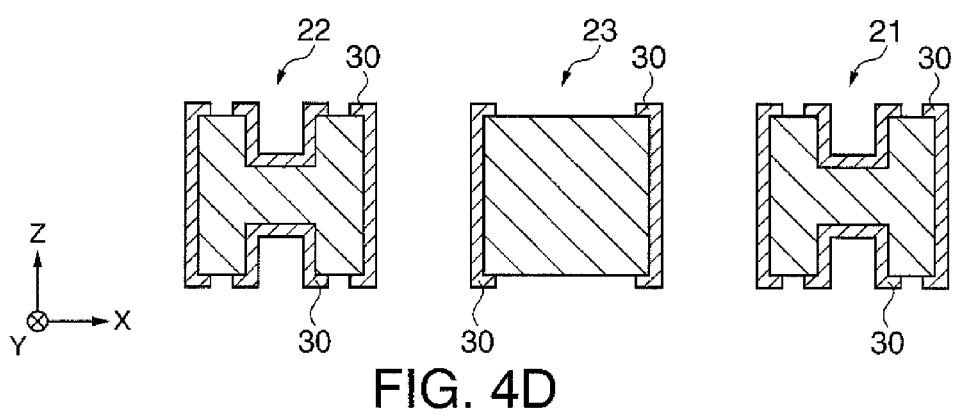

Subsequently, by performing the wet-etching to thereby remove a part of the electrode film 30a exposed from the resist pattern, and then removing the resist pattern, the electrodes 30 are formed. According to the process described hereinabove, the resonator element 1 can be obtained as shown in FIG. 4D.

Second Embodiment

Then, a second embodiment of the invention will be explained.

Figures 5A, 5B:
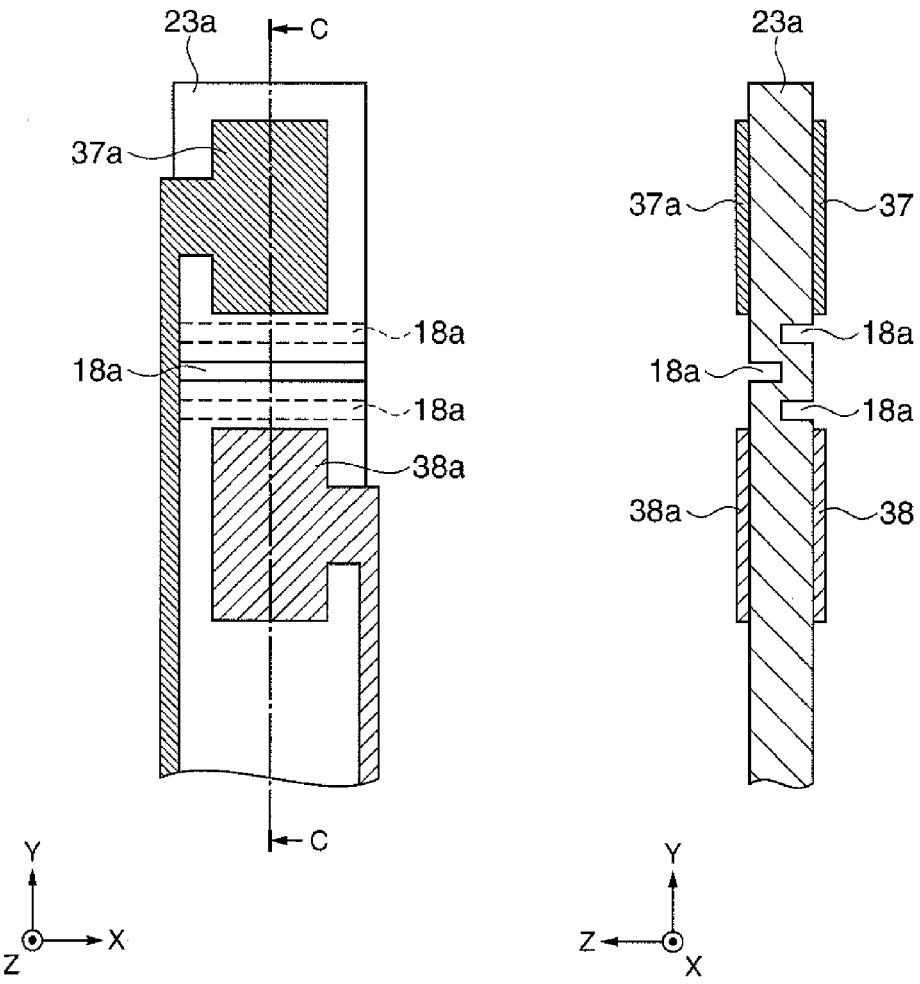

FIGS. 5A and 5B are schematic diagrams showing a structure of a support arm of a resonator element according to the second embodiment of the invention, wherein FIG. 5A is a plan view, and FIG. 5B is a cross-sectional view along the C-C line in FIG. 5A.

Hereinafter, the second embodiment will be explained mainly focused on the differences from the first embodiment described above, and the explanation of substantially the same matters will be omitted.

The second embodiment is substantially the same as the first embodiment except the point that the configuration (the shape) of the support arm is different. It should be noted that in FIGS. 5A and 5B, the components substantially identical to those of the first embodiment described above are denoted with the same reference symbols.

The support arm 23a of the second embodiment shown in FIGS. 5A and 5B is provided with the first electrically-conductive pads 37, 37a respectively disposed at the same positions on the upper surface and the lower surface of the support arm 23a so as to be opposed to each other, and the second electrically-conductive pads 38, 38a respectively disposed at the same positions on the upper surface and the lower surface of the support arm 23a so as to be opposed to each other in a similar manner. Further, a plurality of recessed portions 18a are disposed between the first and second electrically-conductive pads 37, 37a, 38, and 38a. The recessed portions 18a are disposed on the upper surface and the lower surface of the support arm 23a, and each extend in the X-axis direction, and each have both ends opening in the side surfaces of the support arm 23a. Although in the present embodiment, there is adopted the configuration in which one recessed portion 18a is disposed on the upper surface of the support arm 23a, and two recessed portions 18a are disposed on the lower surface thereof, the configuration is not particularly limited, and a plurality of recessed portions can also be disposed on each of the upper surface and the lower surface of the support arm 23a.

According to such a configuration, similarly to the first embodiment, it is possible to prevent the electrically-conductive adhesive from excessively spreading to wet the lower surface of the support arm 23a due to the recessed portions 18a disposed between the first and second electrically-conductive pads 37, 37a, 38, and 38a to thereby effectively prevent the short circuit due to the contact between the electrically-conductive adhesives on the respective first and second electrically-conductive pads 37, 37a, 38, and 38a. Further, since the first and second electrically-conductive pads 37, 37a, 38, and 38a are disposed on the upper surface and the lower surface of the support arm 23a, it is possible to mount the resonator element with the upper surface and the lower surface reversed to each other. Therefore, the mounting failure caused by flipping the resonator element can be prevented, which is extremely effective for improving the production yield.

Third Embodiment

Then, a third embodiment of the invention will be explained.

Figures 6A, 6B:
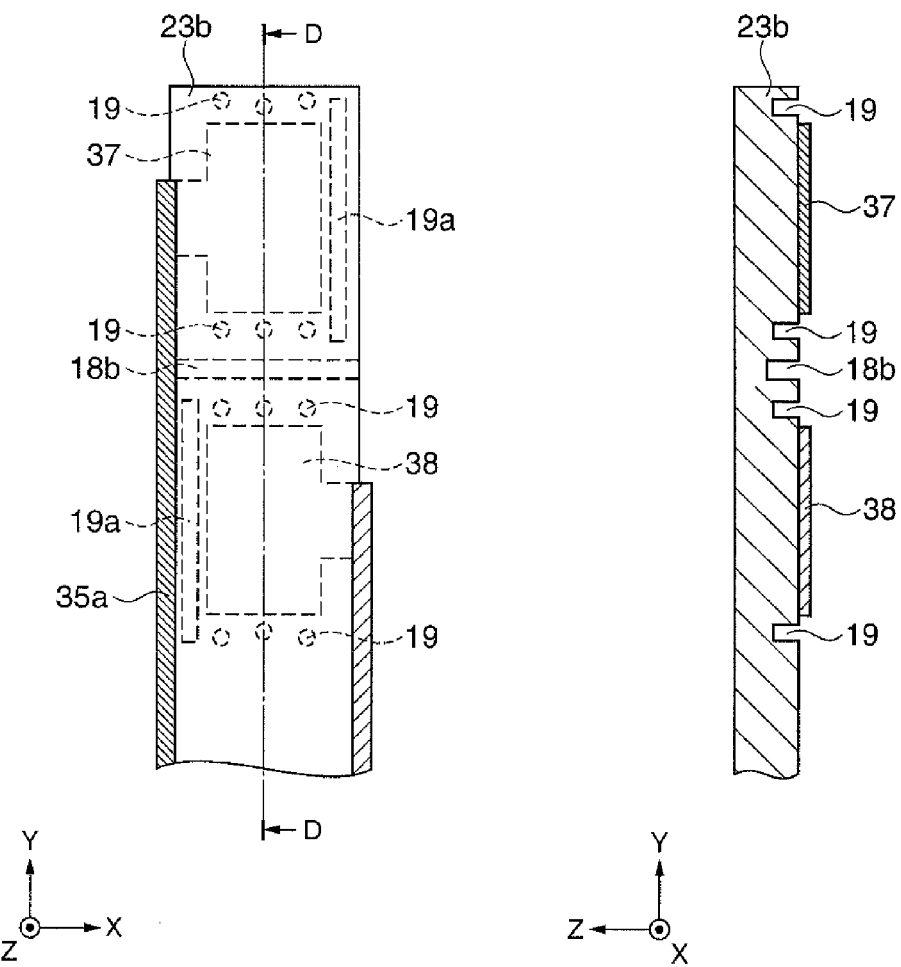

FIGS. 6A and 6B are schematic diagrams showing a structure of a support arm of a resonator element according to the third embodiment of the invention, wherein FIG. 6A is a plan view, and FIG. 63 is a cross-sectional view along the D-D line in FIG. 6A.

Hereinafter, the third embodiment will be explained mainly focused on the differences from the first embodiment described above, and the explanation of substantially the same matters will be omitted.

The third embodiment is substantially the same as the first embodiment except the point that the configuration (the shape) of the support arm is different. It should be noted that in FIGS. 6A and 6B, the components substantially identical to those of the first embodiment described above are denoted with the same reference symbols.

The support arm 23b of the third embodiment shown in FIGS. 6A and 6B is provided with the first and second electrically-conductive pads 37, 38 disposed on the lower surface of the support arm 23b. Between the first and second electrically-conductive pads 37, 38, there is disposed a recessed portion 18b extending in the X-axis direction and having both ends opening in the side surfaces of the support arm 23b. Further, a plurality of holes 19, 19a are disposed along the outer periphery (the outer edge) of each of the first and second electrically-conductive pads 37, 38 continuously side by side or in a scattered manner. In the present embodiment, the lateral cross-sectional shapes (the contour shapes) of the holes 19, 19a are circular shapes or roughly rectangular shapes. However, the lateral cross-sectional shapes (the contour shapes) of the holes 19, 19a are not limited to the circular shapes or the roughly rectangular shapes, but can also be, for example, an elliptical shape or a polygonal shape such as a triangle or a pentagon. Further, the holes 19, 19a can have bottoms, or can be through holes.

According to such a configuration, similarly to the first embodiment, it is possible to prevent the electrically-conductive adhesive from excessively spreading to wet the lower surface of the support arm 23b due to the recessed portion 18b disposed between the first and second electrically-conductive pads 37, 38, and the holes 19, 19a disposed on the periphery of each of the first and second electrically-conductive pads 37, 38 to thereby effectively prevent the short circuit due to the contact between the electrically-conductive adhesives on the respective first and second electrically-conductive pads 37, 38. Further, among the holes 19, 19a disposed on the periphery of the second electrically-conductive pad 38, in particular the hole 19a disposed between the second electrically-conductive pad 38 and the wiring line 35a disposed on the side surface of the support arm 23b is extremely effective for more surely preventing the electrically-conductive adhesive on the second electrically-conductive pad 38 from excessively spreading to wet the lower surface of the support arm 23b to cause the short circuit with the wiring line 35a connected to the first electrically-conductive pad 37 (i.e., since the short circuit between the first and second electrically-conductive pads 37, 38).

Fourth Embodiment

Then, a fourth embodiment of the invention will be explained.

Figures 7A, 7B:
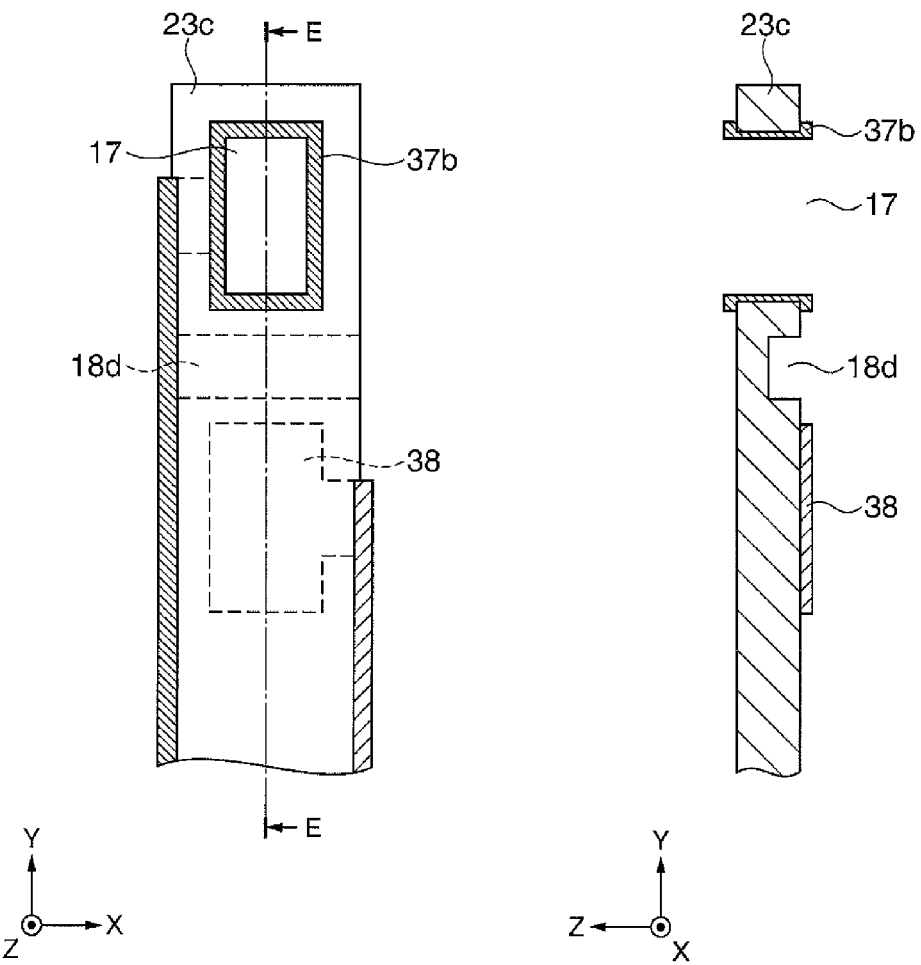

FIGS. 7A and 7B are schematic diagrams showing a structure of a support arm of a resonator element according to the fourth embodiment of the invention, wherein FIG. 7A is a plan view, and FIG. 7B is a cross-sectional view along the E-E line in FIG. 7A.

Hereinafter, the fourth embodiment will be explained mainly focused on the differences from the first embodiment described above, and the explanation of substantially the same matters will be omitted.

The fourth embodiment is substantially the same as the first embodiment except the point that the configuration (the shape) of the support arm is different. It should be noted that in FIGS. 7A and 7B, the components substantially identical to those of the first embodiment described above are denoted with the same reference symbols.

The support arm 23c of the fourth embodiment shown in FIGS. 7A and 7B is provided with a recessed portion 18d extending in the X-axis direction and having both ends opening in the side surfaces of the support arm 23c is disposed between the first and second electrically-conductive pads 37b, 38. The second electrically-conductive pad 38 is disposed on the lower surface of the support arm 23c, and a through hole 17 penetrating the support arm 23c in the thickness direction (the z-axis direction) is disposed at the position where the first electrically-conductive pad 37 of the first embodiment is disposed. Further, the first electrically-conductive pad 37b is disposed on the upper and lower surfaces of the support arm 23c and the inner surface of the through hole 17. It should be noted that although in the present embodiment, the lateral cross-sectional shape (the contour shape) of the through hole 17 is a roughly rectangular shape, the lateral cross-sectional shape of the through hole 17 is not limited to the roughly rectangular shape, but can also be a polygonal shape such as a triangle or a pentagon, a circular shape, or an elliptical shape. Further, the through hole 17 is disposed at the position where the first electrically-conductive pad 37 of the first embodiment is disposed, but can also be disposed at the position of the second electrically-conductive pad 38 of the present embodiment. Further, the position and the size of the through hole 17 are not limited to those fitting into the area of the electrically-conductive pad, but can be those having contact with the electrically-conductive pad.

According to such a configuration, similarly to the first embodiment, it is possible to prevent the electrically-conductive adhesive from excessively spreading to wet the lower surface of the support arm 23c due to the recessed portion 18d disposed between the first and second electrically-conductive pads 37b, 38 to thereby effectively prevent the short circuit due to the contact between the electrically-conductive adhesives on the respective first and second electrically-conductive pads 37b, 38. Further, since the first electrically-conductive pad 37b is also disposed on the inner surface of the through hole 17, it is possible to make the electrically-conductive adhesive used when mounting the resonator element to a package or the like enter the through hole 17. Therefore, it is possible to increase the bonding area between the resonator element and the adhesive, which is extremely effective for surely achieving the electrical conduction, and improving the bonding strength between the resonator element and the package substrate.

Fifth Embodiment

Then a fifth embodiment of the invention will be explained.

Figure 8A:
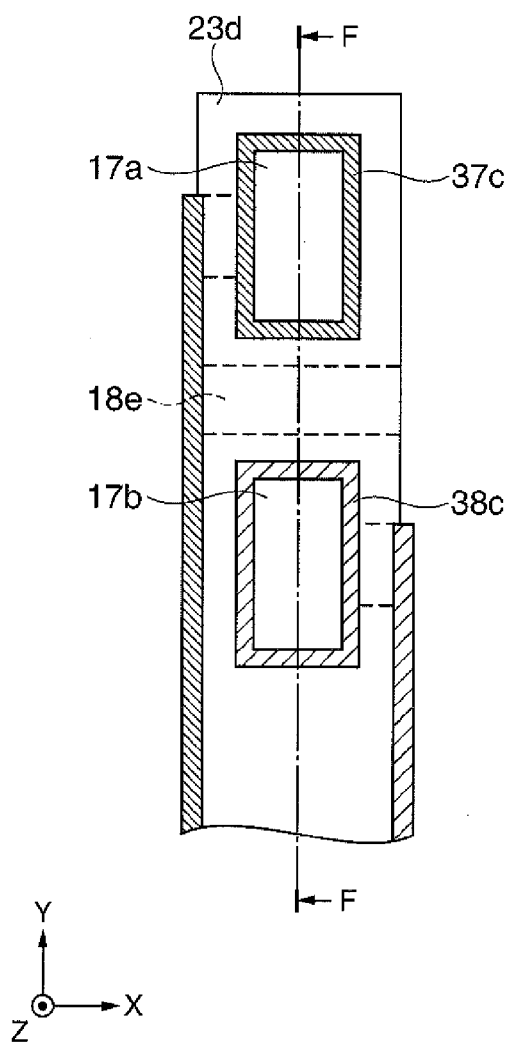
Figure 8B:
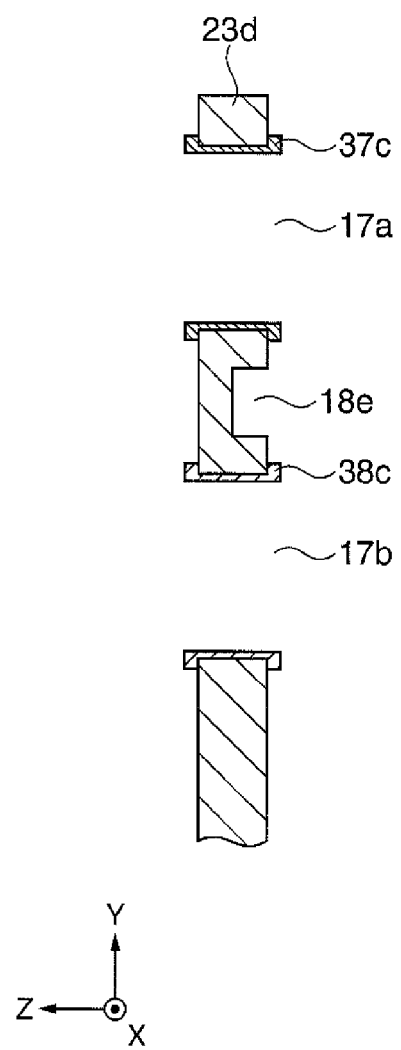

FIGS. 8A and 8B are schematic diagrams showing a structure of a support arm of a resonator element according to the fifth embodiment of the invention, wherein FIG. 8A is a plan view, and FIG. 8B is a cross-sectional view along the F-F line in FIG. 8A.

Hereinafter, the fifth embodiment will be explained mainly focused on the differences from the first embodiment described above, and the explanation of substantially the same matters will be omitted.

The fifth embodiment is substantially the same as the first embodiment except the point that the configuration (the shape) of the support arm is different. It should be noted that in FIGS. 8A and 8B, the components substantially identical to those of the first embodiment described above are denoted with the same reference symbols.

The support arm 23d of the fifth embodiment shown in FIGS. 8A and 8B is provided with a recessed portion 18e extending in the X-axis direction and having both ends opening in the side surfaces of the support arm 23d is disposed between the first and second electrically-conductive pads 37c, 38c. In the positions where the first and second electrically-conductive pads 37, 38 in the first embodiment are disposed, there are disposed through holes 17a, 17b penetrating the support arm 23d in the thickness direction (the Z-axis direction). The first electrically-conductive pad 37c is disposed on the upper and lower surfaces of the support arm 23d and the inner surface of the through hole 17a. Further, the second electrically-conductive pad 38c is disposed on the upper and lower surfaces of the support arm 23d and the inner surface of the through hole 17b. It should be noted that although in the present embodiment, the lateral cross-sectional shapes (the contour shapes) of the through holes 17a, 17b are each a roughly rectangular shape, the lateral cross-sectional shapes of the through holes 17a, 17b are each not limited to the roughly rectangular shape, but can also be a polygonal shape such as a triangle or a pentagon, a circular shape, or an elliptical shape. Further, the position and the size of each of the through holes 17a, 17b are not limited to those fitting into the area of the electrically-conductive pad, but can be those having contact with the electrically-conductive pad.

According to such a configuration, similarly to the first embodiment, it is possible to prevent the electrically-conductive adhesive from excessively spreading to wet the lower surface of the support arm 23d due to the recessed portion 18e disposed between the first and second electrically-conductive pads 37c, 38c to thereby effectively prevent the short circuit due to the contact between the electrically-conductive adhesives on the respective first and second electrically-conductive pads 37c, 38c. Further, since the first and second electrically-conductive pads 37c, 38c are also disposed on the respective inner surfaces of the through holes 17a, 17b, it is possible to make the electrically-conductive adhesives used when the resonator element is supported by and bonded to the package substrate enter the through holes 17a, 17b. Therefore, the bonding area between the resonator element and the adhesives can be increased, which is extremely effective for further improving the bonding strength between the resonator element and the package substrate while surely achieving the electrical conduction.

Resonator

Then, the resonator to which the resonator element according to the embodiment of the invention is applied will be explained.

Figure 9A:
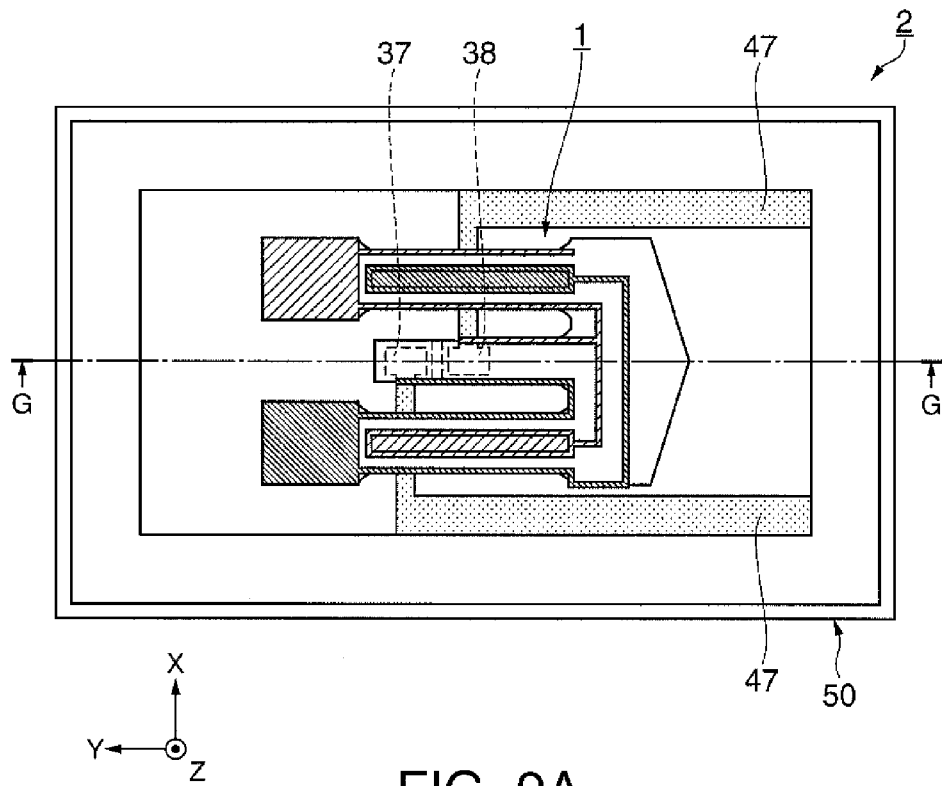
Figure 9B:
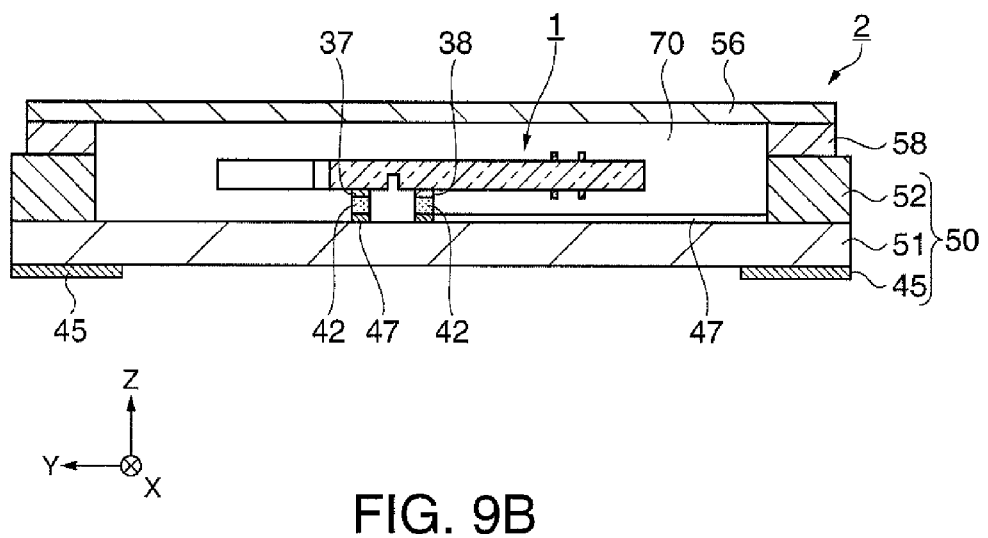

FIGS. 9A and 9B are schematic diagrams showing a structure of the resonator according to the embodiment of the invention, wherein FIG. 9A is a plan view of the resonator, and FIG. 9B is a cross-sectional view along the G-G line of FIG. 9A. It should be noted that in FIG. 9A, for the sake of convenience of explanation of an internal configuration of the resonator, the state of removing a lid member is shown.

The resonator 2 includes the resonator element 1, a package main body 50 having a rectangular box shape for housing the resonator element 1, and the lid member 56 made of, for example, glass, ceramic, or metal. It should be noted that a roughly vacuum reduced-pressure space is formed inside a cavity 70 for housing the resonator element 1.

As shown in FIG. 9B, the package main body 50 is formed by stacking a first substrate 51, a second substrate 52, and mounting terminals 45 on each other. The plurality of mounting terminals 45 is disposed on an exterior bottom surface of the first substrate 51. Further, at predetermined positions on the upper surface of the first substrate 51, there is disposed a plurality of connecting electrodes 47 having electrical conduction with the mounting terminals 45 via through electrodes and inter-layer wiring not shown. The second substrate 52 is a ring-like member with the central portion removed, and is provided with the cavity 70 for housing the resonator element 1.

The first substrate 51 and the second substrate 52 of the package main body 50 explained hereinabove are each formed of a material having an insulating property. Such a material is not particularly limited, and a variety of types of ceramics such as oxide ceramics, nitride ceramics, or carbide ceramics can be used. Further, each of the electrodes, terminals provided to the package main body 50, and wiring patterns and the inter-layer wiring patterns for electrically connecting these electrodes and terminals are typically disposed by printing a metal wiring material such as tungsten (W) or molybdenum (Mo) on the insulating material by screen printing, calcining the material, and then executing plating of nickel (Ni), gold (Au), or the like on the material.

The lid member 56 is preferably formed of a light transmissive material such as borosilicate glass, and is bonded with a sealing material 58 to thereby airtightly seal the package main body 50. Thus, it is arranged to make it possible to perform the frequency adjustment using a mass reduction method by irradiating the tip portion of the resonator element 1 with the laser beam externally input via the lid member 56 after sealing the package main body 50 with the lid member to thereby partially evaporate the electrode disposed in the tip portion. It should be noted that in the case in which such a frequency adjustment is not performed, the lid member 56 can be formed of a metal material such as a kovar alloy.

The resonator element 1 housed in the cavity 70 of the package main body 50 is aligned so that the first and second electrically-conductive pads 37, 38 disposed on the support arm 23 and the two connection electrodes 47 disposed on the upper surface of the first substrate 51 of the package main body 50 correspond to each other, and is bonded via a bonding member 42. By using an electrically-conductive bonding member such as a bump formed of metal or solder, or an electrically-conductive adhesive as the bonding member 42, mechanical bonding can be achieved while achieving electrical connection.

Oscillator

Then, an oscillator to which the resonator element according to the embodiment of the invention is applied will be explained.

Figure 10:
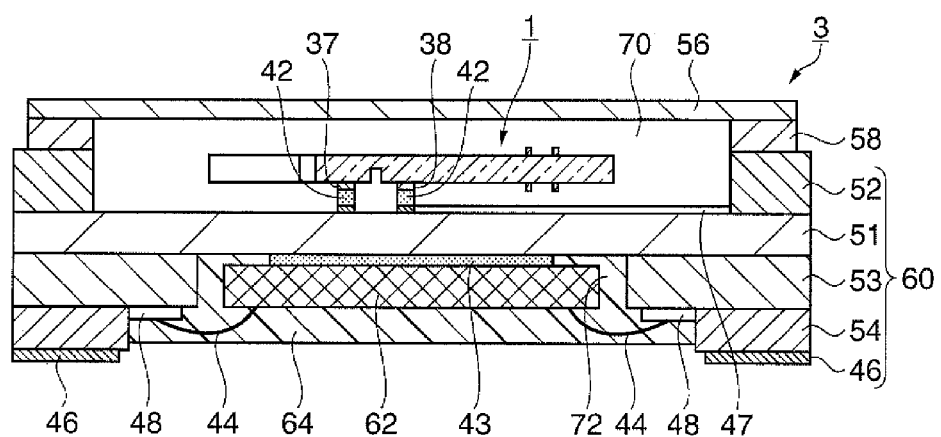
FIG. 10 is a schematic diagram showing a structure of an oscillator according to an embodiment of the invention.

FIG. 10 is a schematic diagram showing a structure of the oscillator according to the embodiment of the invention.

The oscillator 3 includes the resonator element 1, a package main body 60 for housing the resonator element 1, an IC chip (a chip part) 62 for driving the resonator element 1, and the lid member 56 made of, for example, glass, ceramic, or metal. It should be noted that a roughly vacuum reduced-pressure space is formed inside a cavity 70 for housing the resonator element 1.

As shown in FIG. 10, the package main body 60 is formed by stacking a first substrate 51, a second substrate 52, a third substrate 53, a fourth substrate 54, mounting terminals 46 on each other. Further, the package main body 60 has the cavity 70 opening in the upper surface, and a cavity 72 opening in the lower surface.

The plurality of mounting terminals 46 is disposed on an exterior bottom surface of the fourth substrate 54. Further, the mounting terminals 46 are electrically connected to the connection electrodes 47 disposed on the upper surface of the first substrate 51 and the connection terminals 48 disposed on the lower surface of the third substrate 53 via through electrodes and inter-layer wiring not shown.

Similarly to the resonator 2 according to the present embodiment, the first and second electrically-conductive pads 37, 38 disposed on the support arm 23 and the two connection electrodes 47 disposed on the upper surface of the first substrate 51 of the package main body 60 are aligned so as to correspond to each other, and are bonded via the bonding material 42, and then the cavity 70 of the package main body 60 is bonded with the sealing material 58 such as borosilicate glass, and is thus airtightly sealed.

Meanwhile, the IC chip 62 is housed in the cavity 72 of the package 60, and the IC chip 62 is fixed to the lower surface of the first substrate 51 via the bonding member 43 such as brazing filler metal or an adhesive. Further, at least two connection electrodes 48 are disposed inside the cavity 72. The connection electrodes 48 are each electrically connected to the IC chip 62 with a bonding wire 44. Further, the cavity 72 is filled with a resin material 64, and the IC chip 62 is encapsulated with the resin material 64.

The IC chip 62 has a driver circuit (an oscillator circuit) for controlling the drive of the resonator element 1, and by driving the resonator element 1 using the IC chip 62, a signal with a predetermined frequency can be taken out.

Electronic Apparatus

Then, the electronic apparatus to which the resonator element according to the embodiment of the invention is applied will be explained in detail with reference to FIGS. 11 through 13.

Figure 11:
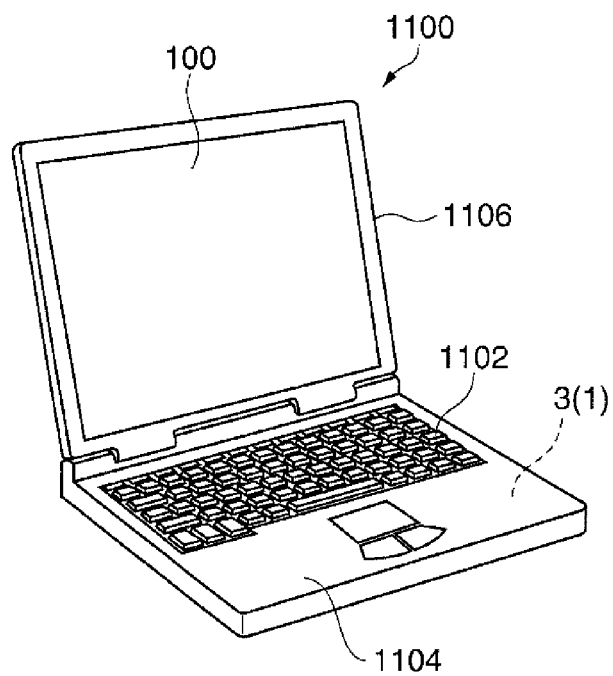
FIG. 11 is a perspective view showing a configuration of a mobile type (or a laptop type) personal computer as an electronic apparatus equipped with the resonator element according to the embodiment of the invention.

FIG. 11 is a perspective view showing a configuration of a mobile type (or a laptop type) personal computer as an electronic apparatus equipped with the resonator element according to the embodiment of the invention. In the drawing, the personal computer 1100 includes a main body section 1104 provided with a keyboard 1102, and a display unit 1106 provided with a display section 100, and the display unit 1106 is pivotally supported with respect to the main body section 1104 via a hinge structure. Such a personal computer 1100 incorporates the oscillator 3 (the resonator element 1).

Figure 12:
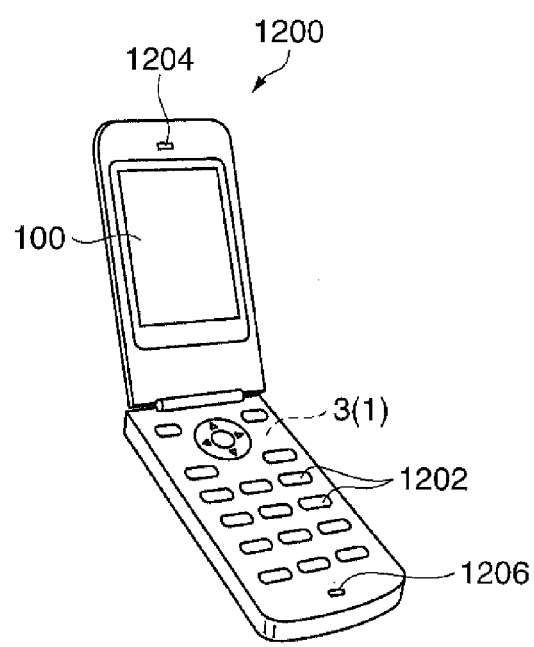
FIG. 12 is a perspective view showing a configuration of a cellular phone (including PHS) as an electronic apparatus equipped with the resonator element according to the embodiment of the invention.

FIG. 12 is a perspective view showing a configuration of a cellular phone (including PUS) as an electronic apparatus equipped with the resonator element according to the embodiment of the invention. In this drawing, the cellular phone 1200 is provided with a plurality of operation buttons 1202, an ear piece 1204, and a mouthpiece 1206, and the display section 100 is disposed between the operation buttons 1202 and the ear piece 1204. Such a cellular phone 1200 incorporates the oscillator 3 (the resonator element 1).

Figure 13:
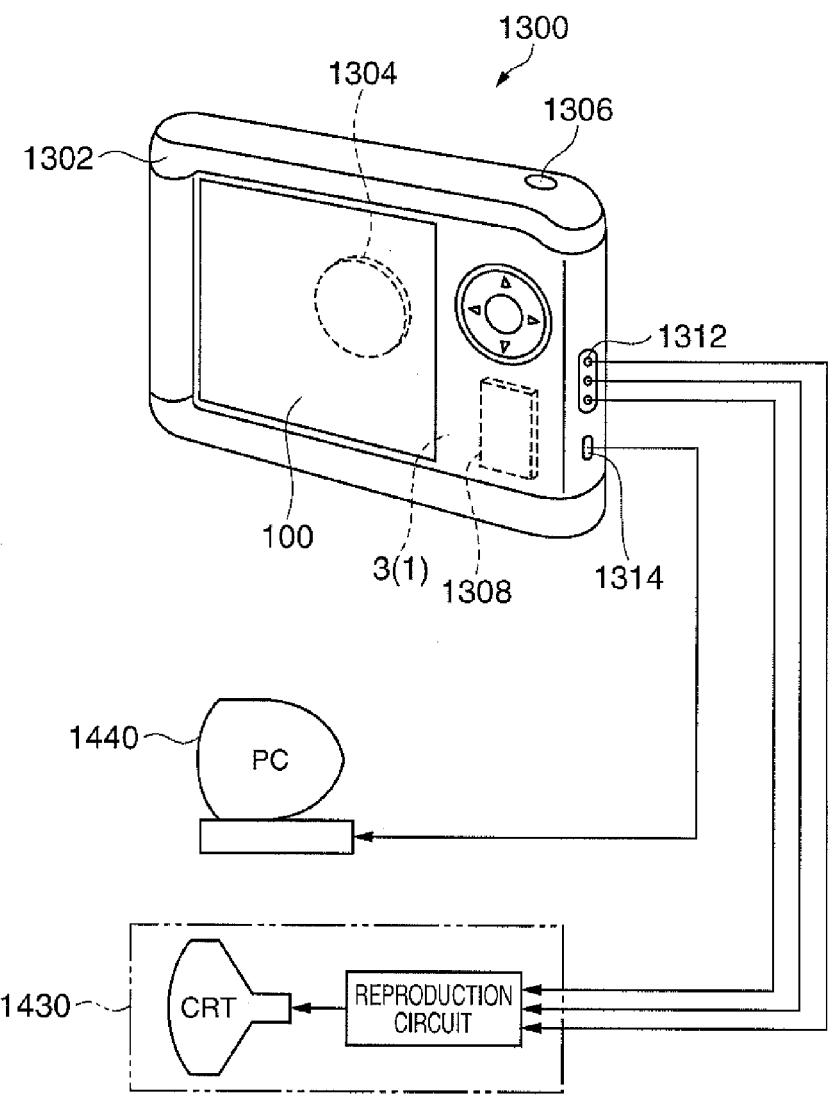
FIG. 13 is a perspective view showing a configuration of a digital still camera as an electronic apparatus equipped with the resonator element according to the embodiment of the invention.

FIG. 13 is a perspective view showing a configuration of a digital camera as an electronic apparatus equipped with the resonator element according to the embodiment of the invention. It should be noted that the connection with external equipment is also shown briefly in this drawing. Here, typical cameras expose silver salt films to an optical image of an object on the one hand, the digital camera 1300 performs photoelectric conversion on the optical image of the object by an image capture element such as a CCD (a charge coupled device) to generate an imaging signal (an image signal), on the other hand.

A case (a body) 1302 of the digital camera 1300 is provided with the display section 100 disposed on the back surface thereof to have a configuration of performing display in accordance with the imaging signal from the CCD, wherein the display section 100 functions as a viewfinder for displaying the object as an electronic image. Further, the front surface (the back side in the drawing) of the case 1302 is provided with a light receiving unit 1304 including an optical lens (an imaging optical system), the CCD, and so on.

When the photographer checks an object image displayed on the display section 100, and then holds down a shutter button 1306, the imaging signal from the CCD at that moment is transferred to and stored in the memory device 1308. Further, the digital camera 1300 is provided with video signal output terminals 1312 and an input/output terminal 1314 for data communication disposed on a side surface of the case 1302. Further, as shown in the drawing, a television monitor 1430 and a personal computer (PC) 1440 are respectively connected to the video signal output terminals 1312 and the input/output terminal 1314 for data communication if needed. Further, there is adopted the configuration in which the imaging signal stored in the memory device 1308 is output to the television monitor 1430 and the personal computer 1440 in accordance with a predetermined operation. Such a digital camera 1300 incorporates the oscillator 3 (the resonator element 1).

It should be noted that, as the electronic apparatus equipped with the resonator element according to the embodiment of the invention, there can be cited, for example, an inkjet ejection device (e.g., an inkjet printer), a laptop personal computer, a television set, a video camera, a video cassette recorder, a car navigation system, a pager, a personal digital assistance (including one with communication function), an electronic dictionary, an electric calculator, a computerized game machine, a word processor, a workstation, a video phone, a security video monitor, a pair of electronic binoculars, a POS terminal, a medical device (e.g., an electronic thermometer, an electronic manometer, an electronic blood sugar meter, an electrocardiogram measurement instrument, an ultrasonograph, and an electronic endoscope), a fish detector, various types of measurement instruments, various types of gauges (e.g., gauges for a vehicle, an aircraft, or a ship), and a flight simulator besides the personal computer (the mobile personal computer) shown in FIG. 11, the cellular phone shown in FIG. 12, and the digital camera shown in FIG. 13.

mobile Object

Figure 14:
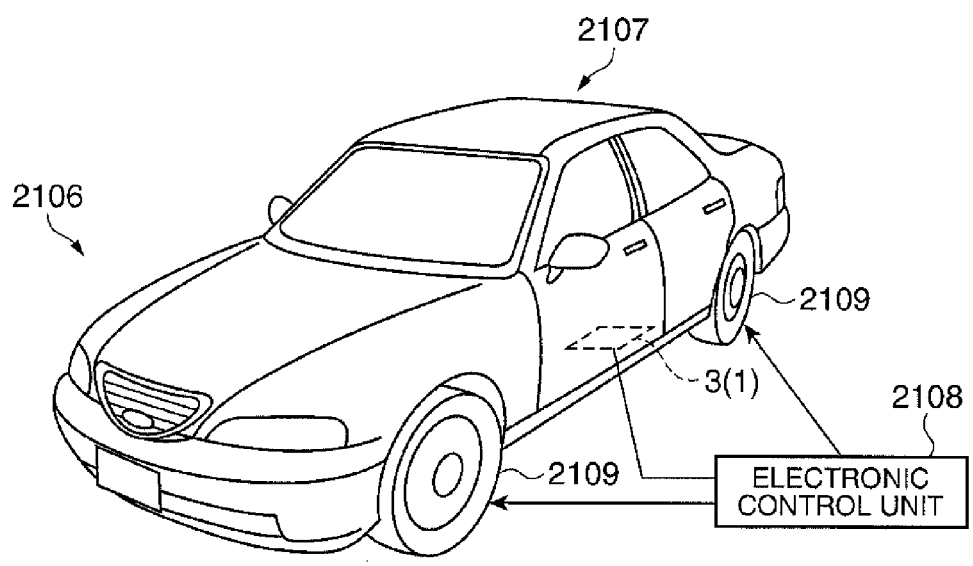
FIG. 14 is a perspective view showing a configuration of a vehicle as a mobile object to which the resonator or the oscillator each equipped with the resonator element according to the embodiment of the invention is applied.

FIG. 14 is a perspective view schematically showing a vehicle as a mobile object to which the resonator or the oscillator each equipped with the resonator element according to the embodiment of the invention is applied. In this drawing, an electronic control unit 2108 for controlling tires 2109 incorporates the oscillator 3 (the resonator element 1), and is installed in a vehicle body 2107.

The resonator or the oscillator each provided with the resonator element according to the embodiment of the invention is installed in the vehicle 2106, and can widely be applied to an electronic control unit (ECU) 2108 such as a keyless entry system, an immobilizer, a car navigation system, a car air-conditioner, an antilock brake system (ABS), an air-bag system, a tire pressure monitoring system (TPMS), an engine controller, a battery monitor for a hybrid car or an electric car, or a vehicle posture control system.

Although the resonator element, the resonator, the oscillator, the electronic apparatus, and the mobile object according to the embodiment of the invention are hereinabove explained based on the embodiments shown in the accompanying drawings, the invention is not limited to these embodiments, but the configuration of each of the components can be replaced with one having an arbitrary configuration with an equivalent function. Further, it is possible to add any other components to the invention. Further, it is also possible to arbitrarily combine any of the embodiments.

Further, the contour of the shrunk-width portion 16 of the embodiment described above can be provided with a projecting section or a recessed section (a cutout).

The entire disclosure of Japanese Patent Application No. 2012-201304, filed Sep. 13, 2012 is expressly incorporated by reference herein.

What is claimed is:

1. A resonator element comprising:
   a base section;
   a pair of vibrating arms projecting toward one direction from the base section, and disposed side by side in a direction intersecting with the one direction; and
   a support arm projecting toward the one direction from the base section, disposed between the pair of vibrating arms, and provided with a first electrically-conductive pad and a second electrically-conductive pad disposed on one principal surface,
   wherein in a plan view of the one principal surface, the one principal surface of the support arm is provided with a first recessed portion disposed between the first electrically-conductive pad and the second electrically-conductive pad.

2. The resonator element according to claim 1, wherein the support arm is provided with at least one hole disposed along an outer edge of at least one of the first electrically-conductive pad and the second electrically-conductive pad.

3. The resonator element according to claim 1, wherein the support arm is provided with at least one through hole, and
   an opening of the through hole is disposed in an outer edge of at least one of the first electrically-conductive pad and the second electrically-conductive pad in a plan view.

4. A resonator comprising:
   the resonator element according to claim 1; and
   a container adapted to house the resonator element.

5. An oscillator comprising:
   the resonator element according to claim 1; and
   an oscillator circuit.

6. An electronic apparatus comprising:
   the resonator element according to claim 1.

7. A mobile object comprising:
   the resonator element according to claim 1.

8. The resonator element according to claim 1, wherein the first recessed portion has a bottom, and
   another principal surface of the support arm is provided with a second recessed portion having a bottom and disposed so as not to overlap the first recessed portion in a plan view of the one principal surface.

9. A resonator comprising:
   the resonator element according to claim 8; and
   a container adapted to house the resonator element.

10. An oscillator comprising:
    the resonator element according to claim 8; and
    an oscillator circuit.

11. An electronic apparatus comprising:
    the resonator element according to claim 8.

12. A mobile object comprising:
    the resonator element according to claim 8.

* * * * *